United States Patent [19]
Houston

[11] Patent Number: 5,905,290
[45] Date of Patent: May 18, 1999

[54] SINGLE EVENT UPSET HARDENED MEMORY CELL

[75] Inventor: Theodore W. Houston, Richardson, Tex.

[73] Assignee: Texas Instruments Incorporated, Dallas, Tex.

[21] Appl. No.: 08/101,348

[22] Filed: Aug. 2, 1993

Related U.S. Application Data

[63] Continuation of application No. 07/719,900, Jun. 24, 1991, abandoned.

[51] Int. Cl.⁶ .................................................. H01L 29/76
[52] U.S. Cl. ........................ 257/380; 365/156; 257/379; 257/532
[58] Field of Search ................... 365/72, 156; 257/379, 257/380, 532, 536

[56] References Cited

U.S. PATENT DOCUMENTS

| | | | |
|---|---|---|---|
| 3,767,944 | 10/1973 | Stehlin | 365/156 |
| 4,130,892 | 12/1978 | Gunckel, II et al. | 365/156 |
| 4,387,444 | 6/1983 | Edwards | 365/156 |
| 4,403,306 | 9/1983 | Tokushige et al. | 365/156 |
| 4,532,609 | 7/1985 | Iizuka | 365/156 |
| 4,725,981 | 2/1988 | Rutledge | 365/154 |
| 4,805,148 | 2/1989 | Diehl-Nagle et al. | 365/154 |
| 4,863,878 | 9/1989 | Hite et al. | 437/26 |
| 4,912,675 | 3/1990 | Blake et al. | 365/154 |
| 4,914,629 | 4/1990 | Blake et al. | 365/154 |
| 4,956,814 | 9/1990 | Houston | 365/154 |
| 5,046,044 | 9/1991 | Houston et al. | 365/156 |
| 5,204,990 | 4/1993 | Houston et al. | 257/304 |

FOREIGN PATENT DOCUMENTS 2-150062   6/1990   Japan .

*Primary Examiner*—Olik Chaudhuri
*Assistant Examiner*—N. Kelley
*Attorney, Agent, or Firm*—Robby T. Holland; Carlton H. Hoel; Richard L. Donaldson

[57] ABSTRACT

A bi-stable logic device 110 comprises first and second inverters 112 and 114. A first resistive connection 140 is made between the input 134 of the first inverter 112 and the output B_ of the second inverter 114 and a second resistive connection 142 is made between the input 138 of the second inverter 114 and the output B of the first inverter 112. The first and said second resistive connections are also capacitively coupling. The device 110 is hardened from single event upset. Other systems and methods are also disclosed.

32 Claims, 3 Drawing Sheets

SINGLE EVENT UPSET HARDENED MEMORY CELL

This application is a Continuation of application Ser. No. 07/719,900, filed Jun. 24, 1991 now abandoned.

This invention was made with government support under contract number DNA001-C-86-0090 awarded by the Defense Nuclear Agency of the Department of Defense. The Government may have certain rights in this invention.

FIELD OF THE INVENTION

This invention generally relates to the fabrication of semiconductor devices and specifically to a single event upset hardened memory cell.

BACKGROUND OF THE INVENTION

Static memory cells in certain environments in which radiation is present such as communication satellite orbital space are, or will likely be, particularly susceptible to soft errors or single event upsets (SEUs). A soft error or single event upset is typically caused by electron-hole pairs created by, and along the path of, a single energetic particle as it passes through an integrated circuit, such as a memory. The charge collected from this ion track will perturb the voltage of the struck node. If the struck node is in a memory cell, and the changed logic state persists longer than the time required to latch a new state in that memory cell (i.e., if the restoration time is longer than the latch time) the cell will be upset. This condition is generally expressed in terms of the critical charge. Should the charge collected from the ionized trail of an energetic particle through a critical volume of the memory cell exceed a critical charge then the logic state of the memory is upset. This critical charge, by definition, is the minimum amount of electrical charge required to change the logic state of the memory cell.

The energetic particle causing the ionization trail may be a cosmic ray or it may be an alpha particle (helium nucleus) such as alpha particles which may be emitted from standard integrated circuit packages for example.

One method for hardening a memory cell against SEU is by reducing the amount of charge generated by a given event. This is accomplished, for example, by using a silicon film thinner than the collection depth in the bulk material. For instance, a memory cell created on an insulator, such as in a SOI (silicon on insulator) device, is less susceptible to SEU than one created on bulk semiconductor, such as silicon, because ionization charge along a path in an insulator is more likely to recombine than be collected compared to ionization charge created in a semiconductor.

Another way to reduce the susceptibility of a memory cell to upset is by increasing the critical charge of the cell. One approach to improving the SEU rate based on increasing the critical charge is to increase the capacitance on the inverter drains, thus decreasing the voltage change on the node for a given amount of collected charge. The effectiveness of the capacitance in increasing the critical charge for SEU is increased by having the capacitance from the drain to the gate of the same inverter to get the benefit of the Miller effect. Still, the area required for a sufficiently large capacitor makes this undesirable for high levels of SEU resistance.

Another hardening scheme against SEU in static memory cells based on critical charge required to produce SEU is accomplished by increasing the feedback time of the latch, thus allowing more time for the restoration current to restore the original state of the memory cell before the upset state is latched. This can be accomplished by including resistors in the cross coupling lines of the two cross coupled inverters which comprise the memory cell. However, this approach of increasing the RC propagation delay also significantly slows the write cycle time of the cell. In addition, it is difficult to control the values of the resistors at the levels necessary for this feedback approach. Therefore, this resistive approach to SEU hardening is no longer desirable.

The improvement in SEU response of a memory cell by increasing the RC delay of the feedback can be accomplished by increasing the capacitance; however, the write speed will also be negatively impacted in this case. In addition, generally, added capacitance will take up more room than increasing the resistivity of the resistor. Therefore, adding capacitance to increase RC delay of the feedback has not been a preferred approach.

Another method used to increase SEU hardness is to include a pair of transistors connected in the cross coupling of the inverters. This method is non optimal, however, because it requires a larger area than would currently be desired.

Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for a single event upset hardened memory cell.

A bi-stable static logic device is built from two inverters. A first resistive connection is made between the input of the first inverter and the output of the second inverter and a second resistive connection is made between the input of the second inverter and the output of the first inverter. In addition, extra capacitance is added from the gate to drain at either end of the resistors, and/or distributed along the resistors. The circuit may be formed on a silicon on insulator (SOI) device. Several variations and modifications are also disclosed.

An advantage of the invention is that the resistance makes the capacitance more effective in providing a negative feedback. The resistance somewhat isolates the gate from the drain of the opposite inverter, resulting in a larger voltage variation on the gate from the capacitive coupling to voltage variation on the gate from the capacitive coupling to voltage variations on the drain of the same inverter. This negative feed back dynamically increases the restoration current. The increased restoration current is very effective in increasing the resistance to SEU since there is only a limited amount of charge from the ion trail to potentially cause an upset. Conversely, there is essentially unlimited charge when the cell is written into by current through the access transistor, and the dynamically increased restoration current does not significantly affect the time to write. Thus the susceptibility to upset is decreased while only minimally impacting write speed. The effectiveness of this combination of resistance and capacitance in preventing upset is greater than would be expected without realization of the enhancement of the negative feedback. This fact allows for faster writing for a given level of upset resistance or more upset resistance for a given area of capacitance.

Further, the density of an array of cells may be increased since a smaller amount of area is being used. Increased density is a great advantage since more memory cells may be included on a chip.

BRIEF DESCRIPTION OF THE DRAWINGS

The above features of the present invention will be more clearly understood from consideration of the following descriptions in connection with accompanying drawings in which.

Corresponding numerals and symbols in the different FIGS. refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. A conventional static memory cell will be described first along with a description of some prior SEU hardening techniques. A first preferred embodiment will be described next followed by a description of modifications.

Figure 1:
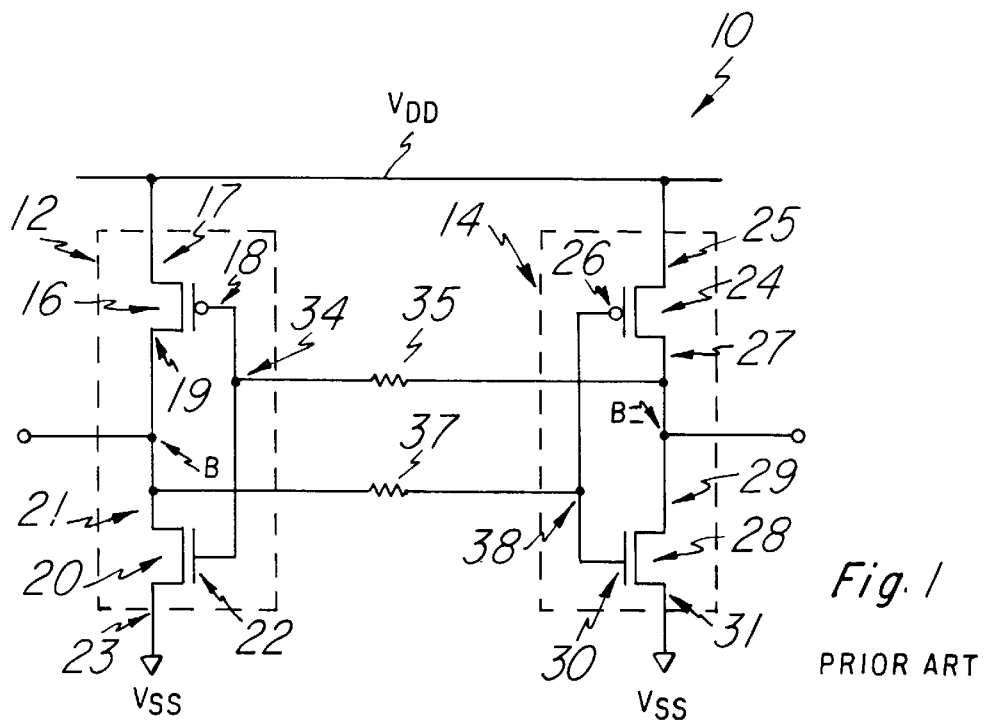
FIG. 1 is a prior art static memory cell.

Referring first to FIG. 1, a conventional static random access memory (SRAM) cell 10 is shown. The SRAM cell 10 includes inverter 12 which is cross coupled with inverter 14. In the cells shown, inverter 12 includes PMOS (p-channel metal oxide semiconductor) transistor 16 and NMOS (n-channel metal oxide semiconductor) transistor 20. The source 17 of PMOS transistor 16 is connected to a first voltage level $V_{DD}$, typically five volts for example. The drain 19 of PMOS transistor 16 is connected to the drain 21 of NMOS transistor 20 at the output node B. The gate 18 of PMOS transistor 16 is connected to the gate 22 of NMOS transistor 20 at the input node 34. The source 22 of NMOS transistor 20 is connected to a second voltage level $V_{SS}$, typically ground for example. Likewise inverter 14 includes PMOS transistor 24 and NMOS transistor 28. The source 25 of PMOS transistor 24 is also connected to a first voltage level $V_{DD}$. The drain 27 of PMOS transistor 24 is connected to the drain 29 of NMOS transistor 28 at the second inverter output node B_. The gate 26 of PMOS transistor 24 is connected to the gate 30 of NMOS transistor 28 at the second inverter input node 38. The source 31 of NMOS transistor 28 is connected to a second voltage level $V_{SS}$.

The memory cell 10 operates as a bi-stable logic device since the output B has a voltage level of either $V_{DD}$ or $V_{SS}$ volts. The second inverter output node B_ has the opposite voltage level of the output B. As an example of steady state operation, if the node B is high (i.e., at voltage level $V_{DD}$), NMOS transistor 28 is rendered non-conductive while PMOS transistor 24 is rendered non-conductive. The voltage at node B_ will then be low (i.e., at voltage level $V_{SS}$). Since B_ is coupled to second inverter input 34, transistor 16 will be conductive and the transistor 20 will be non-conductive, maintaining B at a high level. The memory cell may be written to or read from using well-known addressing techniques which for the sake of simplicity will not be discussed here.

In order to decrease the probability of single event upset (SEU) or a soft error, a resistor 37 may be included in the connection between first inverter output B and second inverter input 38. Likewise, a second resistor 35 may be included between second inverter output B_ and first inverter input 34. Typically with the resistor values for this approach, the minimum time to write into the cell is significantly increased.

In other applications, the capacitance between drain 21 and the gate 22 has been increased to decrease the probability of SEU. In this case, the cell area typically increases significantly.

Figure 2:
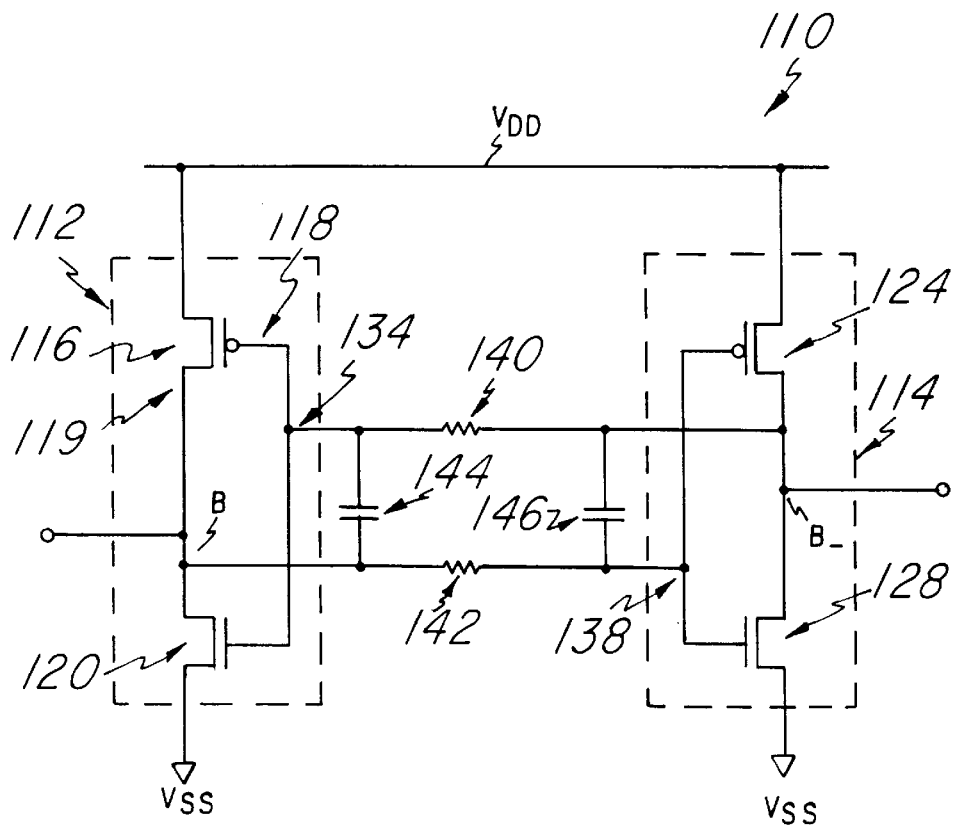
FIG. 2 is a first preferred embodiment circuit.

An SEU hardened static memory cell built according to the present invention is shown in FIG. 2. The cell 110 includes cross coupled inverters 112 and 114. The inverter 112 includes a PMOS transistor 116 and an NMOS transistor 120 which are connected as described with respect to FIG. 1. Likewise, the inverter 114 includes a PMOS transistor 124 and an NMOS transistor 120.

The connection between input node 134 and output node B_ is resistive as denoted by resistor 140. Additionally, a resistive connection 142 exists between output node B and input node 138. Also shown in FIG. 2 is the capacitive coupling 144 between node 134 and output node B as well as the capacitive coupling 146 between input node 138 and output node B_.

Typically, the resistance value of resistors 140 and 142 are between about 5 and 50 kohms and the capacitive coupling 144 and 146 is between about 1 and 10 femtofarads.

An unexpected synergistic relationship exists when both the resistors 140 and 142 and the capacitors 144 and 146 are included. In other words, the SEU hardening is enhanced to an extent far greater than would be expected from the increase in RC delay in the feedback or from the decreased change in voltage for a given charge collection, that is from the bases of the resistive or capacitive approaches to SEU hardening. It is thought that the better than expected results exist because of an enhancement of the restoration current. The resistor 140 (142) acts to isolate the gate 134 (138) from the opposite drain B_(B), thereby increasing the effectiveness of the negative feedback of the capacitive coupling of the gate to the associated drain.

The combination of resistance and capacitance is particularly effective. The gate-to-drain capacitance provides negative feedback that increases restoration current. The resistance, in addition to slowing the feedback loop, somewhat isolates the gate from the other drain, thus making its voltage more responsive to the capacitive coupling to its associated drain, making the capacitance more effective in providing negative feedback. With the negative feedback increasing the restoration current, the RC delay of the feedback loop of the latch does not have to be as large as it would otherwise need to be to give the same level of SEU resistance.

In the circuit, the resistors 140 and 142 may be lumped elements such as polysilicon resistors which are well-known in the art. Additionally, the resistors 140 and 142 may be distributed by using resistive connections such as lightly doped silicon or polysilicon.

The capacitive coupling 144 and 146 may also be accomplished in a number of ways. The gate 118 may be built to overlap the drain 119 in transistor 116. This extra overlap may be contiguous with the channel region of the transistor, such as by using an extended LDD (lightly doped drain) region, or may be separated from the channel region, although optionally still using gate oxide to form the capacitor. This overlap region will create a capacitance between the desired nodes. Of course, overlapped regions may additionally or alternatively occur at the other junctions in the circuit. In addition, the capacitive coupling 144 and 146 may be formed from discrete capacitors built in the circuit.

Figure 3:
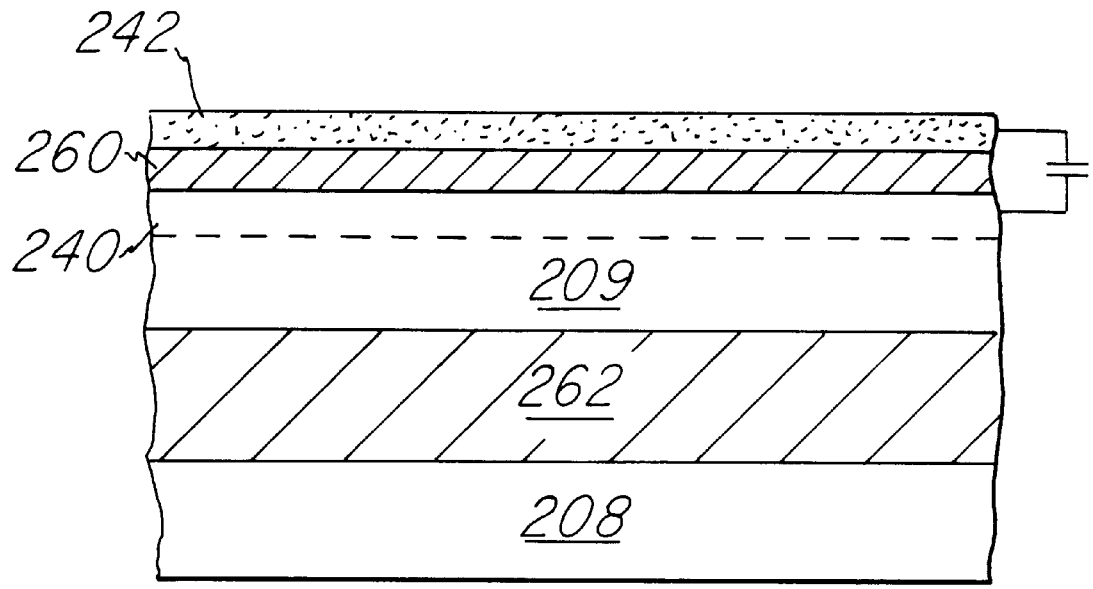
FIG. 3 is a cross sectional view of one RC connection embodiment.

Referring to FIG. 3 which illustrates the cross coupling connection only, in one example in which the circuit is built on a single crystal silicon, the first resistive connection 240 may be formed from single crystal silicon. The second resistive connection 242 may then be a resistive polysilicon layer formed over the first resistive connection but separated therefrom by a thin insulating material 260, such as an oxide for example. The insulating material is chosen such that the desired capacitance exists between the first and second resistive connections. This may be done with a single section or with multiple sections such that each resistive connection from gate to drain includes both single crystal 240 and polycrystaline 242 silicon sections. Typically this would be constructed similar to a transistor, where one resistive section 240 is the body material of a transistor and another resistive section 242 is the gate material, and the separating dielectric 260 is the gate dielectric. Materials other than silicon, such as gallium arsenide for example, can be used for the body material 240. Materials other than polysilicon, such as molybdenum for example, may be used as the gate material 242. In addition, a depletion region can be used to separate the two conductors instead of an oxide as an example. One or both of the conductors may be in the same plane as one or the other of the body and gate of transistors in the inverters, or one or the other or both may be stacked relative to the transistors.

Figure 4:
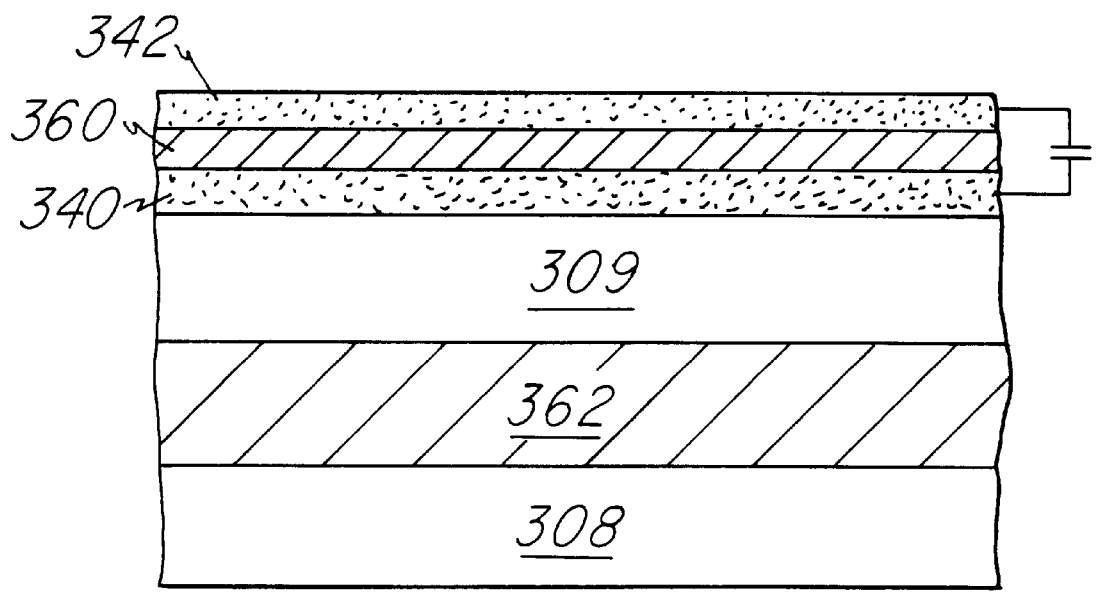
FIG. 4 is a cross sectional view of another RC connection embodiment.

In another example, illustrated cross-sectionally in FIG. 4, the first resistive connection 340 may be a first polysilicon layer and the second resistive connection 342 a second polysilicon layer formed thereon. Once again, the polysilicon layers are separated by a thin insulating material 360 which is chosen such that the desired capacitance exists between the first and second resistive connections.

As illustrated in FIGS. 3 (and 4), the memory device 110 may be formed in a silicon layer 209 (309) which has been formed on an insulating layer 262 (362), such as silicon dioxide for example. The SOI (silicon on insulator) technology is well known in the current art and may or may not be used here.

Figure 5:
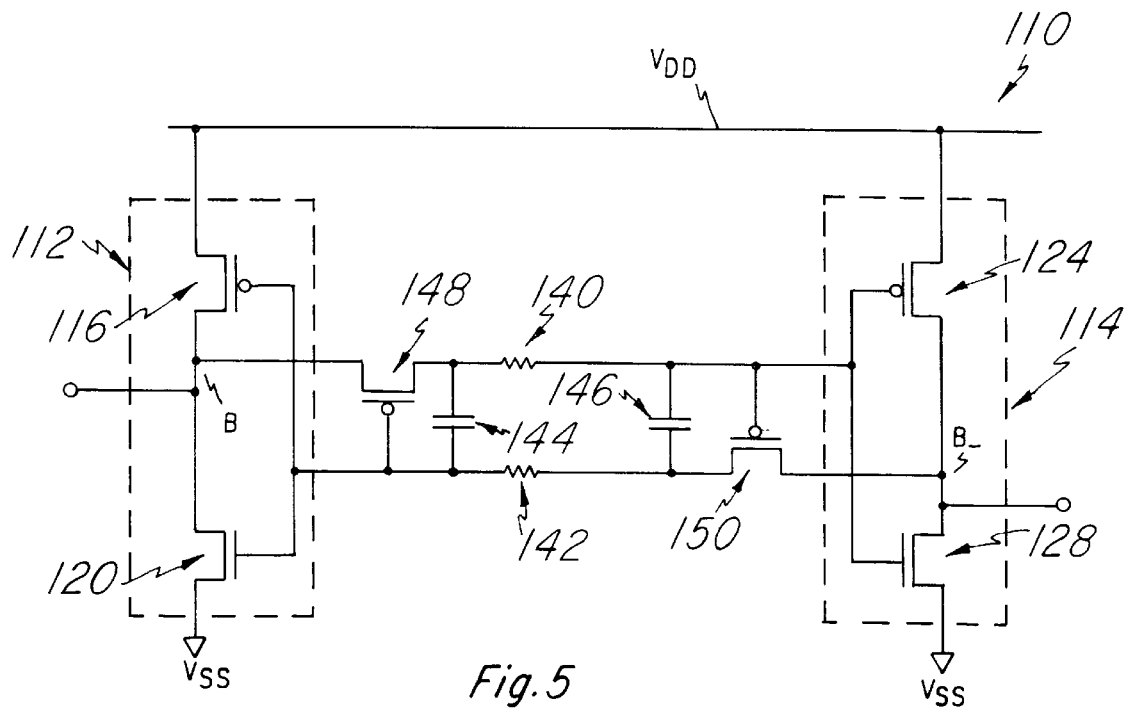
FIGS. 5–6 are alternate embodiment circuits.
Figure 6:
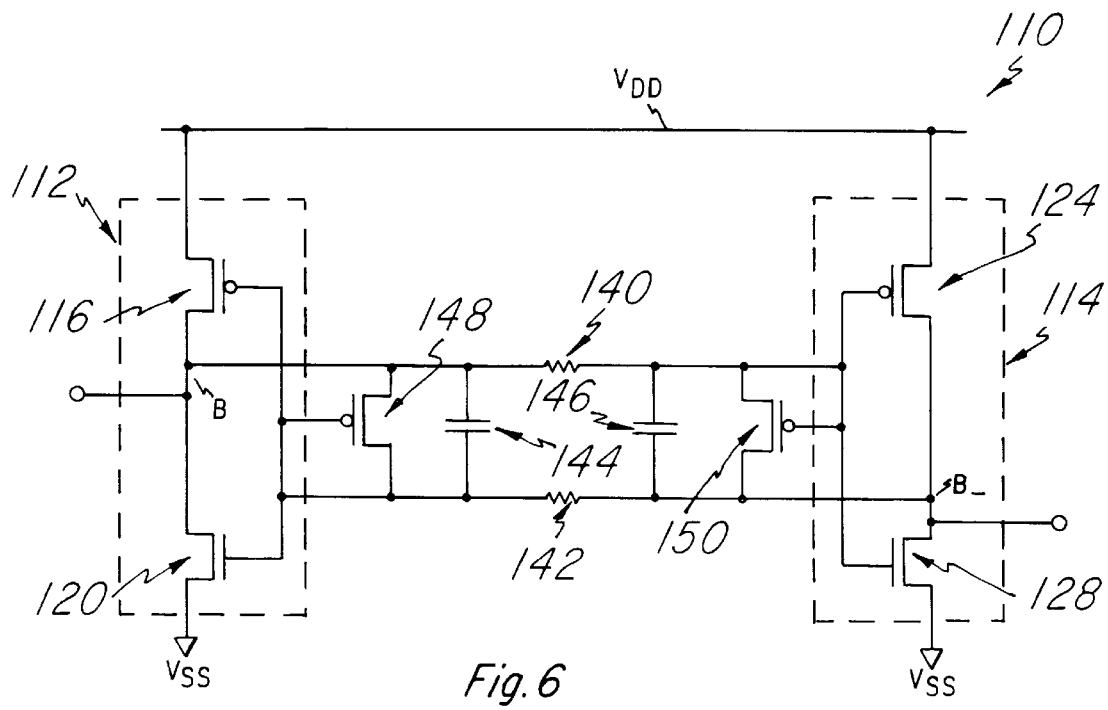

An alternate embodiment is shown in FIG. 5. The circuit of FIG. 5 is the same as that of FIG. 2 with the addition of transistors 148 and 150 in the cross coupling. Another variation is shown in FIG. 6 in which the transistors are placed in parallel with the associated resistors. Other variations of the placement of the transistors relative to the resistors and capacitors in the cross coupling are possible. In particular, the lumped capacitors may be omitted as the gate capacitance of the transistors can provide the required capacitance. The transistors 148 and 150 provide additional flexibility in optimizing the trade-offs of SEU hardness, write speed, and cell area as described in U.S. Pat. No. 4,956,814 and U.S. Pat. No. 4,914,629, incorporated herein by reference. In addition, the body node of the transistors 148 and 150 may be coupled to the drain as described in U.S. Pat. No. 4,912,675, incorporated herein by reference.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bi-stable logic device comprising:
   first and second inverters each said first and second inverters including an input and an output;
   a first resistor between the input of said first inverter and the output of said second inverter;
   a second resistor coupled between the input of said second inverter and the output of said first inverter;
   a capacitive coupling between the input of said first inverter and the output of said first inverter such that said first resistor isolates said capacitive coupling from the output of said second inverter and said second resistor isolates said capacitive coupling from the input of said second inverter.

2. The device of claim 1 and further comprising a second capacitive coupling between the input of said second inverter and the output of said second inverter.

3. The device of claim 2 wherein said first and second resistors comprise lumped resistors.

4. The device of claim 2 wherein said capacitive coupling comprises at least one lumped capacitor.

5. The device of claim 2 wherein said first and second resistors and said capacitive coupling comprise a distributed resistor/capacitor connection.

6. The device of claim 2 wherein said first and second resistors are separated by a thin insulating layer.

7. The device of claim 6 wherein said first resistor comprises single crystal silicon and said second resistor comprises polysilicon.

8. The device of claim 6 wherein said first and second resistors comprise polysilicon.

9. The device of claim 2 and further comprising a first transistor connected in series with said first resistor and a second transistor connected in series with said second resistor.

10. The device of claim 2 and further comprising a first transistor connected in parallel with said first resistor and a second transistor connected in parallel with said second resistor.

11. The device of claim 1 wherein said first and second inverters comprise CMOS transistors, each transistor including a source, a drain and a gate.

12. The device of claim 11 wherein said gate of said transistors overlap said drain of said transistors.

13. The device of claim 1 wherein said bi-stable logic device is one cell in an array of static random access memory cells.

14. An integrated circuit device comprising:
   an insulating layer formed on a semiconductor substrate;
   a semiconductor layer formed on said insulating layer;
   first and second inverters formed in said semiconductor layer each of said first and second inverters including an input and an output;
   a first resistor between the input of said first inverter and the output of said second inverter;
   a second resistor coupled between the input of said second inverter and the output of said first inverter;
   a capacitive coupling between the input of said first inverter and the output of said first inverter such that said first resistor isolates said capacitive coupling from the output of said second inverter and said second resistor isolates said capacitive coupling from the input of said second inverter.

15. The device of claim 14 wherein said first and second resistors comprise lumped resistors and said capacitive coupling comprises a lumped capacitor.

16. The device of claim 14 wherein said first and second resistors and said capacitive coupling comprise a distributed resistor/capacitor connection.

17. The device of claim 14 wherein said first and second resistors are separated by a thin insulating layer.

18. The device of claim 11 wherein said first and second inverters comprise CMOS transistors, each transistor including a source, a drain and a gate.

19. The device of claim 18 wherein said gate of said transistors overlap said drain of said transistors.

20. An electronic latch with enhanced dynamic negative feedback comprising:
   first and second elements wherein negative feedback is provided by capacitive coupling from an input of said first element to an output of said first element; and
   an isolation element connected between said input of said first element and an output of said second element.

21. The latch of claim 20 wherein said first and second elements comprise inverters.

22. The latch of claim 20 wherein said isolation element is a resistor.

23. An integrated circuit memory device comprising:
   first and second inverters formed in a semiconductor layer, each said first and second inverters including an input region and an output region;
   a first resistive region formed in said semiconductor layer, said first resistive region coupling said input of said first inverter to said output of said second inverter;
   an insulating layer formed over said first resistive region;
   a resistive layer formed over said insulating layer; and
   a second resistive region coupling said input of said second inverter to said output of said first inverter, said second resistive region formed in said resistive layer.

24. The device of claim 23 and further comprising an insulating layer formed on a semiconductor substrate wherein said semiconductor layer is formed over said insulating layer.

25. The device of claim 23 wherein said resistive layer comprises polysilicon.

26. The latch of claim 21 wherein said first and second elements comprise CMOS inverters, each CMOS inverter comprising an n-channel and a p-channel transistor, each having a source and drain and a gate.

27. The latch of claim 26 wherein a gate-to-drain capacitance with said n-channel and said p-channel transistor of said first element provides a negative feedback which increases restoration current.

28. An integrated circuit memory device comprising:
   first and second inverters formed in a semiconductor layer, each said first and second inverters including an input region and an output region;
   a first resistive region coupling said input of said first inverter to said output of said second inverter;
   an insulating layer formed over said first resistive region;
   a resistive layer formed over said insulating layer; and
   a second resistive region coupling said input of said second inverter to said output of said first inverter, said second resistive region formed in said resistive layer.

29. The device of claim 28 wherein said first resistive region is formed in a resistive layer overlying said semiconductor layer.

30. The device of claim 28 wherein said first resistive region is formed in said semiconductor layer.

31. The device of claim 28 wherein said semiconductor layer comprises a silicon layer.

32. The device of claim 28 wherein said resistive layer comprises a polysilicon layer.

* * * * *